(12) United States Patent
Yan et al.

(10) Patent No.: US 12,490,596 B2
(45) Date of Patent: Dec. 2, 2025

(54) DISPLAY PANEL

(71) Applicant: SHENZHEN CHINA STAR OPTOELECTRONICS SEMICONDUCTOR DISPLAY TECHNOLOGY CO., LTD., Guangdong (CN)

(72) Inventors: Ying Yan, Guangdong (CN); Shijian Qin, Guangdong (CN); Hui Huang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 493 days.

(21) Appl. No.: 18/050,914

(22) Filed: Oct. 28, 2022

(65) Prior Publication Data

US 2024/0114724 A1  Apr. 4, 2024

(30) Foreign Application Priority Data

Sep. 29, 2022  (CN) .......................... 202211203958.1

(51) Int. Cl.
*H10K 59/122* (2023.01)
*H10K 50/125* (2023.01)

(52) U.S. Cl.
CPC ......... *H10K 59/122* (2023.02); *H10K 50/125* (2023.02)

(58) Field of Classification Search
CPC .. H10K 59/122; H10K 50/125; H10K 71/135; H10K 59/35; H10K 59/80515
See application file for complete search history.

(56) References Cited

U.S. PATENT DOCUMENTS

2010/0097295 A1* 4/2010 Kwak ................. H10K 50/828
                                                                345/32
2016/0276615 A1  9/2016 Kitabayashi

FOREIGN PATENT DOCUMENTS

CN  111293152 A  6/2020
CN  115411075 A  11/2022

OTHER PUBLICATIONS

Chinese Office Action issued in corresponding Chinese Patent Application No. 202211203958.1 dated Apr. 29, 2025, pp. 1-8.

\* cited by examiner

*Primary Examiner* — Fernando L Toledo
*Assistant Examiner* — Adam S Bowen
(74) *Attorney, Agent, or Firm* — PV IP PC; Wei Te Chung (57) ABSTRACT

A display panel is provided. The display panel includes a substrate, and a plurality of anodes, a pixel definition layer, a light-emitting layer, and a cathode layer that are laminated on the substrate. By collecting the anodes spaced apart from each other in a first direction in a same first pixel opening, number of the first pixel openings in the display area can be reduced, and number of ink droplets that can be sprayed within a single first pixel opening can be increased, so that a risk of bridging between adjacent ones of pixel openings can be lowered.

13 Claims, 6 Drawing Sheets

DISPLAY PANEL

BACKGROUND OF INVENTION

1. Field of Invention

The present application relates to a technical field of displays, and particularly to a display panel.

2. Related Art

Ink jet printing (IJP) technologies have great application prospects in preparation of organic functional layers of active-matrix organic light-emitting diode (AMOLED) display panels. Inkjet printing technologies are to directly drop-coat ink containing organic light-emitting materials into pre-fabricated pixel definition layers, and form desired patterns after solvent is volatilized. Pixel definition layers include banks, and grooves arranged in a plurality of arrays surrounded by the banks, and the grooves are configured to confine the ink. After drying and baking, the ink shrinks to form thin films within area confined by the grooves.

As resolution of display panels increases, pixels are designed to be ever smaller, which requires higher and higher inkjet printing accuracy. The accuracy and drop volume of inkjet printing are becoming more and more difficult to control. Current printing accuracy requires accurate optimization of position, droplet size, and number of droplets before printing desired substrates. If these are not adjusted properly, inks in adjacent grooves tend to overflow and mix together during inkjet printing processes, resulting in occurrence of bridging.

To sum up, there is a problem of bridging in prior art due to poor accuracy of inkjet printing and difficulty in controlling an amount of ink droplets. Therefore, it is imperative to provide a display panel to overcome the above problem.

SUMMARY OF INVENTION

Embodiments of the present application provide a display panel that can alleviate a problem of bridging caused by poor inkjet printing accuracy and difficulty in controlling an amount of ink droplets.

Embodiments of the present application provide a display panel including a display area, a substrate, a plurality of anodes arranged on the substrate, a pixel definition layer disposed on the substrate and including a dam and a plurality of first pixel openings defined between the dam, the first pixel openings being located in the display area and extending from a side edge of the display area to an opposite side edge of the display area in a first direction, and the anodes being spaced apart from each other in the first direction in the first pixel openings, a light-emitting layer disposed at least in each of the first pixel openings and covering each of the anodes in the first pixel openings; and a cathode layer disposed at least on a side of the light-emitting layer away from the substrate.

According to one embodiment of the present application, the anodes are arranged in at least a row in the first direction in the first pixel opening.

According to one embodiment of the present application, the light-emitting layers in each of the first pixel openings have a same light-emitting color.

According to one embodiment of the present application, the pixel definition layer further includes a plurality of second pixel openings defined between the dam, and the second pixel openings are spaced apart from each other in the first direction.

Specifically, at least two anodes are disposed in each of the second pixel openings, and the light-emitting layer is further disposed in the second pixel opening and covers each of the anodes in the second pixel opening.

According to one embodiment of the present application, the first pixel openings and the second pixel openings are alternately and repeatedly arranged in a second direction, and the first direction and the second direction intersect.

According to one embodiment of the present application, number of the anodes in any two adjacent second pixel openings is same in the first direction.

According to one embodiment of the present application, the anodes are arranged in at least a row in the first direction in the second pixel opening.

According to one embodiment of the present application, light-emitting colors of the light-emitting layers in any two adjacent second pixel openings are different from each other in the first direction.

According to one embodiment of the present application, the light-emitting layers in the second pixel openings in a same column have a same light-emitting color.

According to one embodiment of the present application, the light-emitting layer in the first pixel opening has a light-emitting color different from a light-emitting color of the light-emitting layer in the second pixel opening.

According to one embodiment of the present application, a light-emitting color of the light-emitting layer in the first pixel opening is blue, and the light-emitting color of the light-emitting layer in the second pixel opening is red or green.

According to one embodiment of the present application, the pixel definition layer includes a plurality of auxiliary dams disposed on an outer periphery of each of the anodes, and the light-emitting layer covers the auxiliary dams.

According to one embodiment of the present application, an end of each of the auxiliary dams away from the substrate is spaced at a distance from the substrate less than a distance between an end of the dam away from the substrate and the substrate.

Embodiments of the present application have advantageous effects as follows: the embodiments of the present application provides the display panel, including the substrate, and the anodes, the pixel definition layer, the light-emitting layer, and the cathode layer that are laminated on the substrate. The pixel definition layer includes the dam and the first pixel openings defined between the dam. The first pixel openings are located in the display area and extend from a side edge of the display area to an opposite side edge of the display area in the first direction, and the anodes are spaced apart from each other in the first direction in the first pixel openings. By collecting the anodes spaced apart from each other in the first direction in a same first pixel opening, number of the first pixel openings in the display area can be reduced, and number of ink droplets that can be sprayed within a single first pixel opening can be increased, thus lowering a risk of bridging between adjacent ones of the pixel openings.

BRIEF DESCRIPTION OF DRAWINGS

In order to better illustrate the technical solutions in the embodiments or in the prior art, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

FIG. 1 is a schematic plan view of a display area of a display panel according to an embodiment of the present application.

DESCRIPTION OF PREFERRED EMBODIMENTS

The following embodiments are referring to the accompanying drawings for exemplifying specific implementable embodiments of the present application. Directional terms described by the present application, such as upper, lower, front, back, left, right, inner, outer, side, etc., are only directions by referring to the accompanying drawings, and thus the used directional terms are used to describe and understand the present invention, but the present application is not limited thereto. In the drawings, units with similar structures are indicated by the same reference numerals.

The application will be further described below in conjunction with the drawings and specific embodiments.

An embodiment of the present application provides a display panel. The display panel includes a display area AA, a substrate 10, a plurality of anodes 31 arranged on the substrate 10, and a pixel definition layer 32 disposed on the substrate 10. The pixel definition layer 32 includes a dam 320 and a plurality of first pixel openings 321 formed and enclosed by the dam 320. The first pixel openings 321 are located in the display area AA and extend from a side edge of the display area AA to an opposite side edge of the display area AA in a first direction x, and the anodes 31 are spaced apart from each other in the first direction x in the first pixel openings 321. The display panel further includes a light-emitting layer 33 and a cathode layer 34. The light-emitting layer 33 is disposed at least in each of the first pixel openings 321 and covers each of the anodes 31 in the first pixel openings 321. The cathode layer 34 is disposed at least on a side of the light-emitting layer 33 away from the substrate 10.

It should be noted that, being disposed on the substrate 10 may refer to being in direct contact with the substrate 10 or in indirect contact with the substrate 10.

Figure 1:
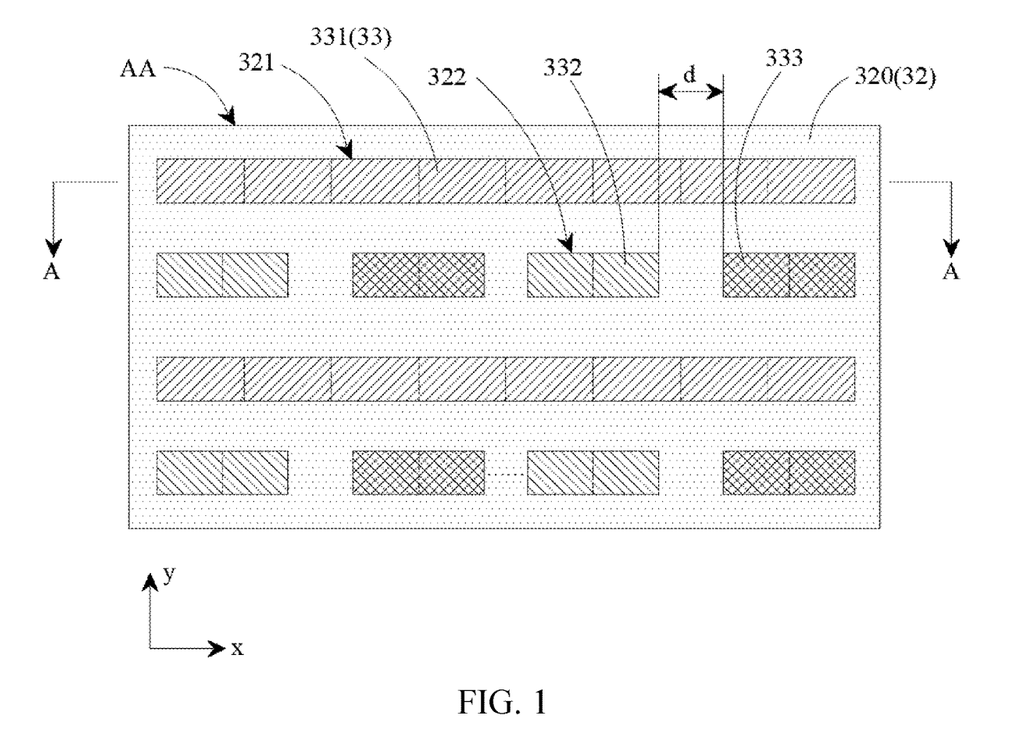
Figure 2:
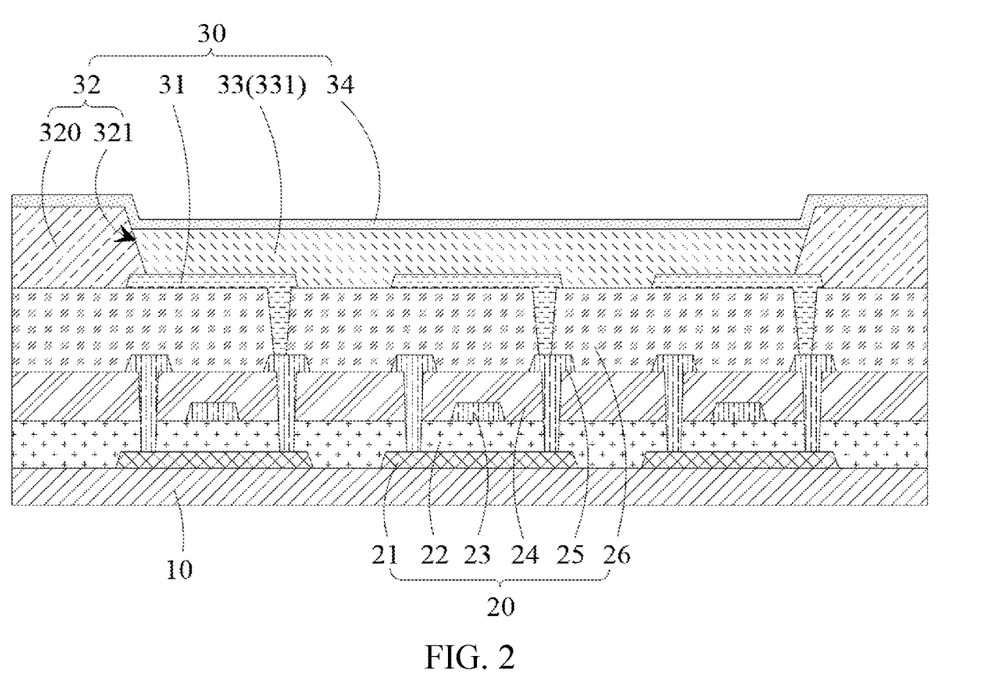
FIG. 2 is a schematic cross-sectional view taken along line A-A in FIG. 1 of the display panel according to an embodiment of the present application.

Referring to FIGS. 1 and 2, FIG. 1 is a schematic plan view of a display area of a display panel according to an embodiment of the present application. FIG. 2 is a schematic cross-sectional view taken along line A-A in FIG. 1 of the display panel according to an embodiment of the present application. The display panel includes a substrate 10, a driving circuit layer 20 disposed on the substrate 10, and a light-emitting functional layer 30 disposed on the driving circuit layer 20.

The driving circuit layer 20 may include, but is not limited to, an active layer 21, a first gate insulating layer 22, a first gate metal layer 23, an interlayer dielectric layer 24, and a source-drain electrode metal layer 25, and stacked a protective layer 26 all disposed on the substrate 10 in a stacked arrangement. It should be noted that FIG. 1 only illustrates a structural relationship between the driving circuit layer 20 and the light-emitting functional layer 30, and does not represent a film layer structure of the driving circuit layer 20 in practical applications.

The light-emitting functional layer 30 may include, but is not limited to, an anode 31, a pixel definition layer 32, a light-emitting layer 33, and a cathode layer 34 disposed on the protective layer 26.

It should be noted that the light-emitting functional layer 30 may also include a common layer (not shown in the figure). The common layer may include a hole injection layer, a hole transport layer, an electron transport layer, and an electron injection layer that are laminated together. The light-emitting layer 33 may be disposed between the hole transport layer and the electron transport layer. The common layer can be prepared by a method including, but is not limited to, full-surface evaporation or inkjet printing.

The pixel definition layer 32 includes the dam 320 and a plurality of the first pixel openings 321 formed and enclosed by the dam 320. Each of the first pixel openings 321 extends through the pixel definition layer 32 in a thickness direction of the pixel definition layer 32 and exposes the anode 31 at a bottom of the pixel definition layer 32.

Further, the first pixel opening 321 extends from a side edge of the display area AA to an opposite side edge of the display area AA in the first direction x.

As shown in FIG. 1, a contour of the first pixel opening 321 is elongated and extends from a left edge of the display area AA to a right edge of the display area AA in the first direction x. In the first direction x, only one of the first pixel openings 321 is disposed in each row, and no other pixel openings are arranged in the same row as the first pixel openings 321.

A plurality of the anodes 31 are arranged in the first pixel openings 321 at intervals in the first direction x.

Figure 3:
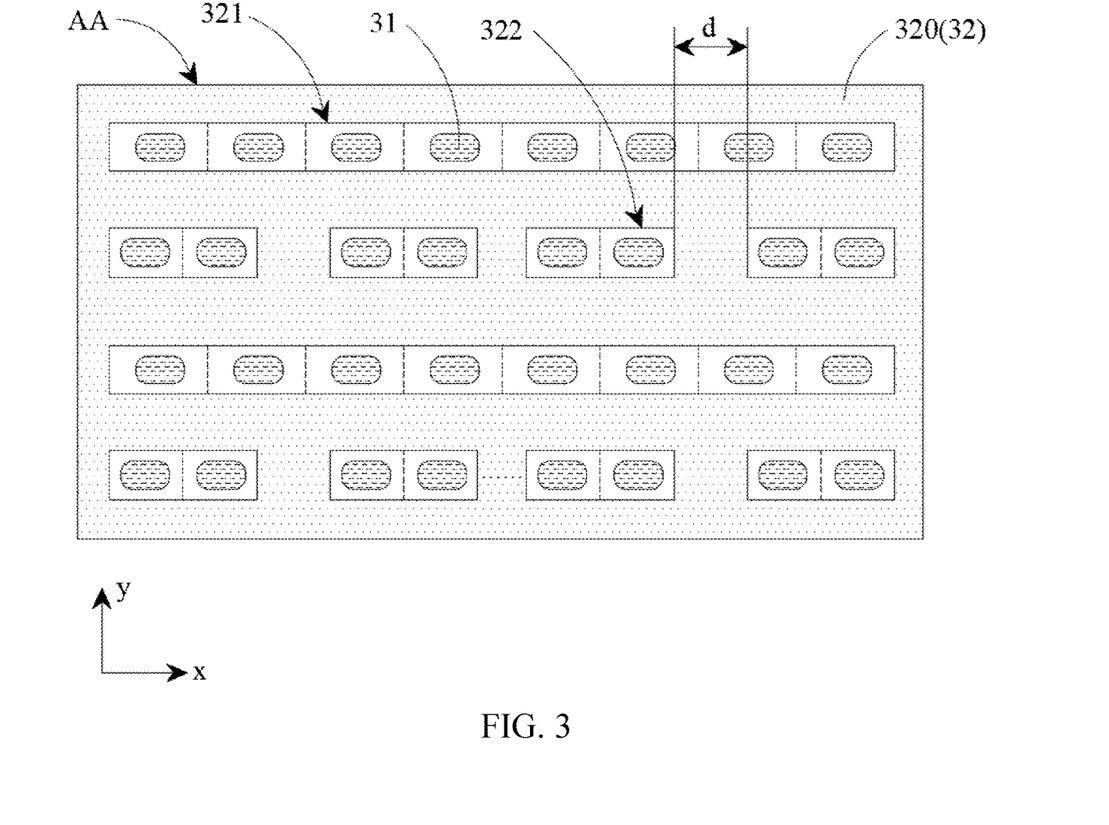
FIG. 3 is a schematic distribution view of anodes in a pixel opening according to an embodiment of the present application.

Referring to FIGS. 1 and 3, FIG. 3 is a schematic distribution view of anodes in a pixel opening according to an embodiment of the present application. The first pixel openings 321 are provided with a plurality of the anodes 31, and the anodes 31 are arranged in the first direction x. in the first pixel opening. The anodes 31 located in a same first pixel opening 321 are insulated from each other, and the anodes 31 in the same first pixel opening 321 are all disposed on a same film layer. For example, the anodes 31 in the same first pixel opening 321 are disposed on a side of the protective layer 26 away from the substrate 10.

It should be noted that FIG. 1 only illustrates a positional relationship between the anode 31 and the first pixel opening 321 and the light-emitting layer 33, FIG. 3 only illustrates the distribution of the anodes 31 in each pixel opening, and numbers of the anodes 31 in the first pixel opening 321 and a second pixel opening 322 in FIGS. 1 and 3 do not represent actual numbers of the anodes 31 in the first pixel opening 321 and the second pixel opening 322 in practical applications. In practical applications, the number of anodes 31 in each of the first pixel openings 321 can be set according to number of subpixels in each row of the subpixels in the display panel, which is not limited here.

The first pixel opening 321 is further provided with the light-emitting layer 33. The light-emitting layer 33 at least fills the first pixel opening 321 and covers each of the anodes 31 in the first pixel opening 321.

The driving circuit layer 20 may include a plurality of pixel driving circuits provided in a one-to-one correspondence with the anodes 31.

As shown in FIG. 1, each of the anodes 31 located in the same first pixel opening 321 has a corresponding pixel driving circuit in the driving circuit layer 20. The pixel driving circuit includes at least a thin-film transistor. A source electrode or a drain electrode of the thin-film transistor can be electrically connected to the anode 31 to drive the light-emitting layer 33 corresponding to the anode 31 to emit light.

It should be noted that FIG. 1 only illustrates a thin-film transistor in the pixel driving circuit, and does not represent the structure of the pixel driving circuit in practical applications. A circuit structure of the pixel driving circuit may be embodied as a circuit structure of any pixel driving circuit in current display panels, which is not limited here.

Referring to FIG. 1, in the embodiment of the present application, part of the light-emitting layer 33 corresponding to the anode 31 can emit light, and part of the light-emitting layer 33 not corresponding to the anode 31 cannot emit light. In this way, the light-emitting layer 33 in the same first pixel opening 321 can be divided into a plurality of mutually independent parts that can emit light. Each part that can emit light independently can be regarded as a subpixel, and number of subpixels included in each of the first pixel openings 321 is equal to number of the anodes 31 disposed in corresponding one of the first pixel openings 321.

It should be noted that the part of the light-emitting layer 33 corresponding to the anode 31 may refer to: in a thickness direction of the display panel, the part of the light-emitting layer 33 that overlaps the anode 31; alternatively, it may also refer to the part of the light-emitting layer 33 in contact with the anode 31. The part of the light-emitting layer 33 not corresponding to the anode 31 may refer to: in the thickness direction of the display panel, the part of the light-emitting layer 33 that does not overlap the anode 31; alternatively, it may also refer to the part of the light-emitting layer 33 not in contact with the anode 31.

Taking the first pixel opening 321 as an example, if the first pixel opening 321 is provided with three anodes, then the first pixel opening 321 is provided with three subpixels; if the first pixel opening 321 is provided with four anodes, then the first pixel opening 321 is provided with four subpixels, and so on, and other situations will not be repeated.

It should be noted that in FIG. 1, dotted lines in the first pixel opening 321 divide the first pixel opening 321 into a plurality of subpixels, and each of the subpixels is configured with a corresponding one of the anodes 31. Due to the shielding of the light-emitting layer 33, the anode 31 below the light-emitting layer 33 is not shown in FIG. 1.

By arranging a plurality of the anodes 31 in the same row in the same first pixel opening 321, the number of the first pixel openings 321 in the display panel can be reduced, so that number of the dams 320 for enclosing and forming the first pixel openings 321 can be reduced, thereby increasing number of ink droplets that can be sprayed in a single first pixel opening 321, reducing accuracy requirements for position, ink droplet size, and the number of ink droplets in an inkjet printing process, improving tolerance for inkjet printing device precision, and reducing a risk of color mixing due to bridging between adjacent pixel openings.

Further, the anodes 321 are arranged in at least a row in the first direction in the first pixel opening 321.

As shown in FIG. 3, a plurality of the anodes 31 are disposed in the first pixel opening 321, the anodes 31 are arranged in a row at intervals in the first direction x in the first pixel opening 321, and only one row of the anodes 31 is disposed in the first pixel opening 321.

It should be noted that the first direction x may be regarded as an advancing direction of inkjet printing, and the second direction y may be regarded as a direction perpendicular to the first direction x. During the process of inkjet printing, a nozzle of an inkjet printing device may spray ink in the corresponding pixel opening in the first direction x.

Further, the light-emitting layers 33 in each of the first pixel openings 321 have a same light-emitting color.

In one embodiment, the light-emitting layers 33 includes a plurality of first light-emitting layer 331 disposed in the first pixel openings 321. All the first pixel openings 321 in the display area AA are provided with the first light-emitting layers 331, and a light-emitting color of each of the first light-emitting layers 331 is blue.

In some other embodiments, the light-emitting color of the first light-emitting layer 331 may also be red or green, which is not limited here.

Further, the pixel definition layer 32 further includes a plurality of the second pixel openings 322 surrounded by the dams 320, and the second pixel openings 322 are spaced apart from each other in the first direction x.

The first pixel opening 321 is disposed on at least one side of the second pixel opening 322 in the second direction y. The first pixel openings 321 and the second pixel openings 322 are alternately and repeatedly arranged in the second direction y, and the first direction x and the second direction y intersect.

As shown in FIG. 2, the first direction x and the second direction y are perpendicular to each other. A plurality of the second pixel openings 322 are arranged in a row in the first direction x at intervals, a row of the second pixel openings 322 is disposed between every two of the first pixel openings 321, and one of the first pixel openings 321 is disposed between every two rows of the second pixel openings 322.

Further, at least two anodes 31 are disposed in each of the second pixel openings 322. The light-emitting layer 33 is also disposed in the second pixel opening 322 and covers each of the anodes 31 in the second pixel opening 322.

In one embodiment, in the first direction x, the number of the anodes 31 in any two adjacent second pixel openings 322 is same.

Referring to FIGS. 2 and 3, the second pixel openings 322 are spaced apart from each other in the first direction x, and each of the second pixel openings 322 is configured with two anodes 31, and the two anodes 31 are arranged at intervals in the first direction x in the second pixel opening 322. The light-emitting layer 33 is also disposed in the second pixel opening 322 and can cover the two anodes 31 in the second pixel opening 322, which is equivalent to arranging two subpixels in each of the second pixel openings 322.

In one embodiment, the light-emitting layer 33 further includes a second light-emitting layer 332 and a third light-emitting layer 333. Light-emitting colors of the second light-emitting layer 332 and the first light-emitting layer 331 are different from each other and also different from the first light-emitting layer 331.

For example, the light-emitting color of the second light-emitting layer 332 is red, and the light-emitting color of the third light-emitting layer 333 is green; alternatively, the light-emitting color of the second light-emitting layer 332 is green, and the light-emitting color of the third light-emitting layer 333 is red.

In one embodiment, in the first direction x, the light-emitting layers 33 located in the second pixel openings 322 in a same row have a same light-emitting color; in the second direction y, the light-emitting colors of the light-emitting layers 33 in two adjacent second pixel openings 322 are different.

For example, two rows of the second pixel openings 322 are arranged between two adjacent first pixel openings 321. Specifically, the second light-emitting layer 332 is disposed in each of the second pixel openings 322 in one row of the second pixel openings 322, and the third light-emitting layer 333 is disposed in each of the second pixel openings 322 in the other row.

In one embodiment, in the first direction x, the light-emitting layers 33 in any two adjacent second pixel openings 322 have different light-emitting colors.

As shown in FIG. 1, the second light-emitting layer 332 and the third light-emitting layer 333 are alternately disposed in the second pixel openings 322 in the same row. For example, in the first direction x, the second light-emitting layer 332 is disposed in a first one of the second pixel openings 322, the third light-emitting layer 333 is disposed in a second one of the second pixel openings 322, and another second light-emitting layer 332 is disposed in a third one of the second pixel openings 322, and another third light-emitting layer 332 is disposed in a fourth one of the second pixel openings 322, and so on. For types of the light-emitting layers disposed in subsequent plurality of the second pixel openings 322 located in the same row, reference may be made to the above-mentioned manner, which will not be repeated here.

By arranging the second light-emitting layer 332 and the third light-emitting layer 333 in the same row, a problem of the low resolution and an obvious grainy appearance caused by a relatively great distance between the second light-emitting layer 332 or the third light-emitting layer 333 and the first light-emitting layer 331 can be prevented.

In one embodiment, in the second direction, the light-emitting layers located in the second pixel openings in a same column have a same light-emitting color.

As shown in FIG. 1, the second light-emitting layers 332 are provided in the second pixel openings 322 in a first column from left to right, and the third light-emitting layers 333 are provided in the second pixel openings 322 in a second column from left to right.

In some other embodiments, the second light-emitting layers 332 and the third light-emitting layers 333 may be alternately disposed in the second pixel openings 322 in the same row. For example, the second light-emitting layer 332 is disposed in a first one of the second pixel openings 322 in the first column, and the third light-emitting layer 333 is disposed in a second one of the second pixel openings 322 in the first column.

In one embodiment, similar to the fact that only one row of the anodes 31 is provided in the first pixel opening 321, each of the second pixel openings 322 is also provided with only one row of the anodes 31.

Two adjacent anodes 31 in the first direction x disposed in a same second pixel opening 322 is equivalent to two adjacent subpixels in the first direction x disposed in the same second pixel opening 322, so that number of the second pixel openings 322 in the same row can be reduced. When impact accuracy of the inkjet printing device is low, a number of subpixels in a row of subpixels corresponding to the second pixel openings 322 in the display panel can be kept unchanged, and a width d of the dam 320 between adjacent ones of the second pixel openings 322 in the first direction x can be increased, so that the risk of bridging and color mixing of color resist materials of adjacent pixel openings due to insufficient impact accuracy of the inkjet printing device can be reduced.

When the impact accuracy of the inkjet printing device is high, the width d of the dam 320 in the first direction x can be kept unchanged, and the number of the second pixel openings 322 can be increased, so that the number of subpixels can be increased, thus improving the resolution of the display panel.

It should be noted that, under the condition of a same area, a luminescence lifetime of a blue organic light-emitting material is shorter than that of a red light-emitting material and a green light-emitting material. By arranging an entire row of the anodes 31 in a same first pixel opening 321, and disposing the first light-emitting layers 331 emitting blue light in the first pixel opening 321, a coverage area of a blue light-emitting material can be increased, thereby improving a lifetime of a blue subpixel.

It should also be noted that, if the second pixel opening 322 is configured in an elongated shape the same as the first pixel opening 321, each row in the display panel is provided with only one first pixel opening 321 or one second pixel opening 322. When color mixing occurs at a certain position of the first pixel opening 321 or the second pixel opening 322, the flow of ink will cause a large-area color mixing to occur. By arranging the second pixel openings 322 at intervals in the first direction x, the risk of large-area color mixing can be reduced.

In one embodiment, as shown in FIG. 3, the first light-emitting layer 331 in the first pixel opening 321 is not limited to the blue light-emitting layer in the above embodiment, and may also be a green light-emitting layer or a blue light-emitting layer.

Figure 4:
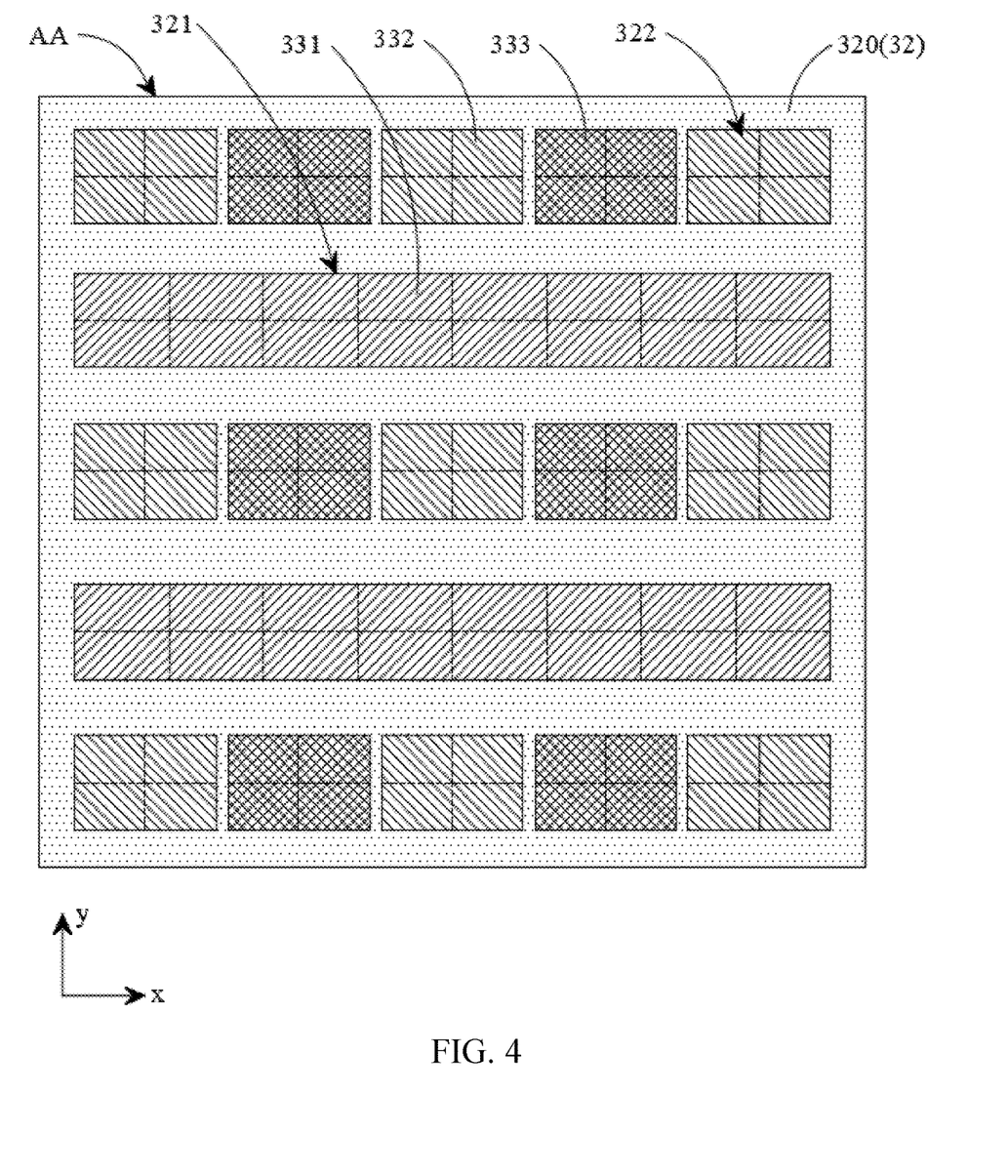
FIG. 4 is a schematic plan view of a display area of another display panel according to an embodiment of the present application.
Figure 5:
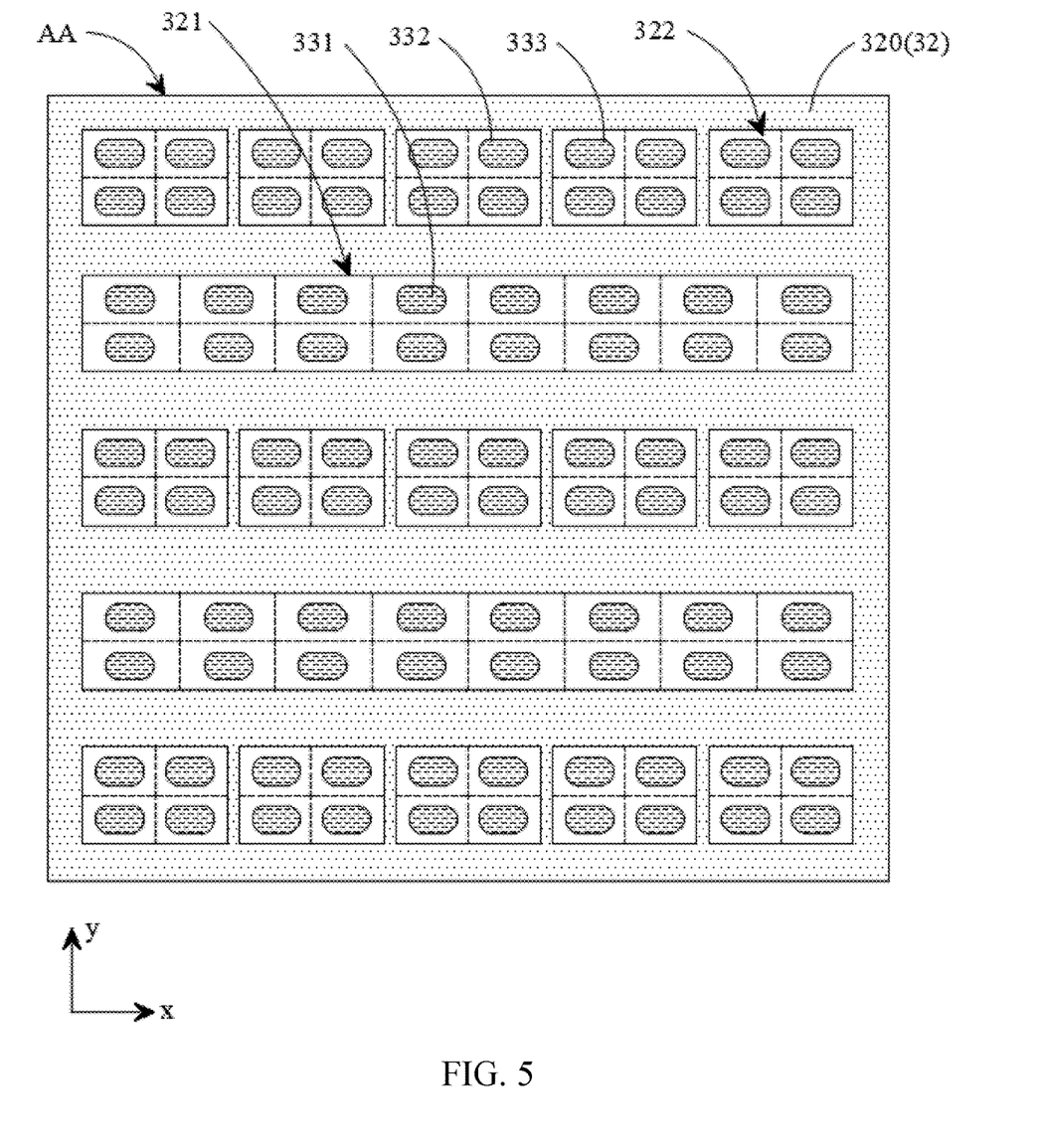
FIG. 5 is a schematic distribution view of anodes in another type of pixel opening according to an embodiment of the present application.

In one embodiment, referring to FIGS. 4 and 5, FIG. 4 is a schematic plan view of a display area of another display panel according to an embodiment of the present application. FIG. 5 is a schematic distribution view of anodes in another type of pixel opening according to an embodiment of the present application. A structure of the display panel in FIG. 5 is substantially the same as that of the display panel shown in FIG. 1, except that the each of the first pixel opening 321 and the second pixel opening 322 is both provided with two rows of the anodes 31.

As shown in FIG. 5, the first pixel opening 321 is provided with two rows of the anodes 31 arranged in the first direction x, and each row may include a plurality of the anodes 31.

The second pixel opening 322 is provided with two rows of the anodes 31 arranged in the first direction x, and each row may include two anodes 31, that is, four anodes 31 may be disposed in each of the second pixel openings 322. By means of the collection of the four anodes 31 into the same second pixel opening 322, when the impact accuracy of the inkjet printing device is low, the width of the dam 320 between the adjacent second pixel openings 322 in the first direction x can be increased, so that the tolerance for the impact accuracy of the inkjet printing device can be improved, and the risk of color mixing between adjacent pixel openings can be reduced. When the impact accuracy of the inkjet printing device is high, the width of the dam 320 between the adjacent second pixel openings 322 in the first direction x can be reduced, and the number of the second pixel openings 322 located in the same row can be increased, so that the number of subpixels located in the same row is increased, thereby improving the resolution of the display panel.

In practical applications, the number of rows of the anodes 31 disposed in the first pixel opening 321 and the second pixel opening 322 is not limited to two rows in the above embodiment, but may also be three rows or more.

It should be noted that the number of rows of the anodes 31 disposed in the first pixel opening 321 and the second pixel opening 322 is not limited to two rows in the above embodiment, but may also be three rows, four rows, or more. In order to prevent the problem of increased graininess due to the relatively great distance between the first pixel opening 321 and the second pixel opening 322, the number of rows of the anodes 31 in the first pixel opening 321 and the second pixel opening 322 in the second direction y should not exceed six rows.

Figure 6:
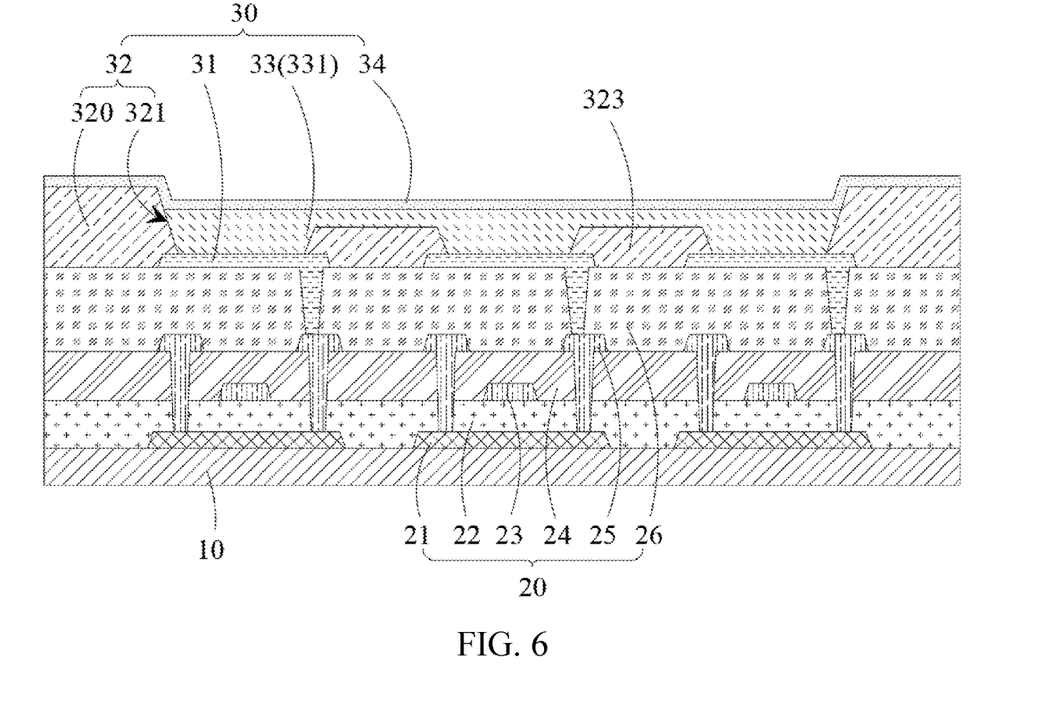
FIG. 6 is a schematic cross-sectional view taken along line A-A in FIG. 1 of the display panel according to another embodiment of the present application.

In one embodiment, as shown in FIG. 6, which is a schematic cross-sectional view taken along line A-A in FIG. 1 of the display panel according to another embodiment of the present application, a structure of the display panel shown in FIG. 6 is substantially the same as that of the display panel shown in FIG. 2, with differences as follows: the pixel definition layer 32 includes a plurality of auxiliary dams 323 disposed on an outer periphery of each of the anodes 31, and the light-emitting layer 33 covers the auxiliary dams 323.

As shown in FIG. 6, the auxiliary dams 323 are arranged on the outer periphery of each anode 31 in the first pixel opening 321, so that the outer periphery of the anode 31 is pressed by the auxiliary dam 323 to prevent warpage of the outer periphery of the anode 31.

In this embodiment of the present application, the auxiliary dam 323 and the dam 320 may be made of a same material.

Further, an end of the auxiliary dam 323 away from the substrate 10 is spaced at a distance from the substrate 10 less than a distance between an end of the dam 320 away from the substrate 10 and the substrate 10. In this way, it is prevented that a height of the auxiliary bank 323 is too large to cut off the light-emitting layer 33 in the first pixel opening 321.

Embodiments of the present application have advantageous effects as follows: the embodiments of the present application provides a display panel, including a substrate, a plurality of anodes arranged on the substrate, a pixel definition layer disposed on the substrate, a light-emitting layer disposed in a pixel opening, and a cathode layer disposed on a side of the light-emitting layer away from the substrate. The pixel definition layer includes a dam and a plurality of the pixel openings formed and enclosed by the dam. By arranging at least two of the anodes spaced apart and insulated from each other in each of the pixel openings, part of the light-emitting layer in contact with the anode can emit light, and part of the light-emitting layer not in contact with the anode cannot emit light. In this way, at least two pixels can be collected in a same pixel opening, thereby reducing the number of pixel openings and increasing a distance between adjacent pixel openings, thus reducing the risk of bridging.

Accordingly, although the preferred embodiments of this application are disclosed as above, the above preferred embodiments are not intended to limit the application. Those of ordinary skill in the art can make various changes and modifications without departing from the scope of this application. Therefore, the scope of protection of this application is based on the scope defined by the claims.

What is claimed is:

1. A display panel, comprising:
a display area;
a substrate;
a plurality of anodes arranged on the substrate;
a pixel definition layer disposed on the substrate and comprising a dam and a plurality of first pixel openings defined between the dam, wherein in a first direction, only one of the first pixel openings is disposed in each row, the first pixel openings are located in the display area and extend from a side edge of the display area to an opposite side edge of the display area in the first direction, and the anodes are spaced apart from each other in the first direction in a same one of the first pixel openings;
a light-emitting layer disposed at least in each of the first pixel openings and covering each of the anodes in the first pixel openings; and
a cathode layer disposed at least on a side of the light-emitting layer away from the substrate.

2. The display panel of claim 1, wherein the anodes are arranged in at least a row in the first direction in the first pixel opening.

3. The display panel of claim 1, wherein the light-emitting layers in each of the first pixel openings have a same light-emitting color.

4. The display panel of claim 1, wherein the pixel definition layer further comprises a plurality of second pixel openings defined between the dam, and the second pixel openings are spaced apart from each other in the first direction;
wherein at least two anodes are disposed in each of the second pixel openings, and the light-emitting layer is further disposed in the second pixel opening and covers each of the anodes in the second pixel opening.

5. The display panel of claim 4, wherein the first pixel openings and the second pixel openings are alternately and repeatedly arranged in a second direction, and the first direction and the second direction intersect.

6. The display panel of claim 4, wherein number of the anodes in any two adjacent second pixel openings in the first direction is same.

7. The display panel of claim 4, wherein the anodes are arranged in at least a row in the first direction in the second pixel opening.

8. The display panel of claim 4, wherein light-emitting colors of the light-emitting layers in any two adjacent second pixel openings are different from each other in the first direction.

9. The display panel of claim 8, wherein the light-emitting layers in the second pixel openings in a same column have a same light-emitting color.

10. The display panel of claim 4, wherein the light-emitting layer in the first pixel opening has a light-emitting color different from a light-emitting color of the light-emitting layer in the second pixel opening.

11. The display panel of claim 9, wherein a light-emitting color of the light-emitting layer in the first pixel opening is blue, and the light-emitting color of the light-emitting layer in the second pixel opening is red or green.

12. The display panel of claim 1, wherein the pixel definition layer comprises a plurality of auxiliary dams disposed on an outer periphery of each of the anodes, and the light-emitting layer covers the auxiliary dams.

13. The display panel of claim 12, wherein an end of each of the auxiliary dams away from the substrate is spaced at a distance from the substrate less than a distance between an end of the dam away from the substrate and the substrate.

* * * * *